United States Patent
Tomita et al.

(10) Patent No.: US 10,682,664 B2
(45) Date of Patent: Jun. 16, 2020

(54) MICROVOLUME-LIQUID APPLICATION METHOD AND MICROVOLUME-LIQUID DISPENSER

(71) Applicant: Engineering System Co., Ltd., Matsumoto-shi, Nagano (JP)

(72) Inventors: Kazuki Tomita, Matsumoto (JP); Kentaro Fukuda, Matsumoto (JP)

(73) Assignee: ENGINEERING SYSTEM CO., LTD., Matsumoto-shi, Nagano (JP)

( * ) Notice: Subject to any disclaimer, the term of this patent is extended or adjusted under 35 U.S.C. 154(b) by 0 days.

(21) Appl. No.: 16/201,054

(22) Filed: Nov. 27, 2018

(65) Prior Publication Data
US 2019/0184419 A1   Jun. 20, 2019

(30) Foreign Application Priority Data
Dec. 14, 2017   (JP) ................ 2017-240068

(51) Int. Cl.
*B05C 5/02* (2006.01)
*H01L 21/67* (2006.01)
*B05B 15/58* (2018.01)
*B05C 11/10* (2006.01)

(52) U.S. Cl.
CPC ............ *B05C 5/0208* (2013.01); *B05B 15/58* (2018.02); *H01L 21/6715* (2013.01); *B05C 5/0216* (2013.01); *B05C 11/1007* (2013.01); *B05C 11/1034* (2013.01)

(58) Field of Classification Search
CPC ....... B05C 5/0208; B05C 5/0216; B05C 5/02; B05C 11/1034; B05C 11/1007; H01L 21/671; B05B 1/086; B05D 1/26; B05D 1/265
See application file for complete search history.

(56) References Cited

U.S. PATENT DOCUMENTS

2017/0008755 A1 * 1/2017 Ishida ................. B67D 7/0261

FOREIGN PATENT DOCUMENTS

| JP | 2000223402 A | 8/2000 | |
| JP | 5802347 B1 | 10/2015 | |
| WO | WO-2015178239 A1 * | 11/2015 | ............. B67D 99/00 |

* cited by examiner

*Primary Examiner* — Dah-Wei D. Yuan
*Assistant Examiner* — Nga Leung V Law
(74) *Attorney, Agent, or Firm* — Buchanan Ingersoll & Rooney PC (57) ABSTRACT

In a microvolume-liquid dispenser, there is performed an application operation for dispensing a microvolume liquid present in an amount measured in nanoliters or picoliters from a nozzle tip-end opening and applying the microvolume liquid to an application surface. When the application operation has not been performed over a time interval longer than a set time interval ta, a tip-end liquid surface of an application liquid in the nozzle tip-end opening is caused to vibrate at a high amplitude that includes the position of a liquid surface height from immediately before application in the case of application at equal time intervals. The subsequently performed application operation is performed at a point in time when the liquid surface height has returned to the liquid surface height. The operation for applying the microvolume application liquid can be precisely performed in the same manner as when application is performed at equal time intervals.

5 Claims, 6 Drawing Sheets

MICROVOLUME-LIQUID APPLICATION METHOD AND MICROVOLUME-LIQUID DISPENSER

TECHNICAL FIELD

The present invention relates to a microvolume-liquid application method and a microvolume-liquid dispenser with which a microvolume-liquid-applying operation, etc., is performed on an application surface such as the surface of a semiconductor substrate using, e.g., a nozzle having a very small diameter of 0.5 mm or less. The microvolume liquid is present in an amount measured in nanoliters or even picoliters.

BACKGROUND ART

Pneumatic liquid dispensers are known as mechanisms for applying a liquid onto an application surface, such as the surface of a semiconductor substrate, in a dotted or linear form. In liquid dispensers, a pump or other pressurizing element is used to pressurize a liquid, and the liquid is dispensed from a nozzle having a prescribed diameter and applied to an application surface. The inventors proposed, in Patent Document 1, a microvolume-liquid dispenser with which it is possible to precisely apply droplets present in an amount measured in nanoliters or even picoliters through an inexpensive configuration using, e.g., a nozzle having a very small diameter of 500 μm or less.

In liquid dispensers for applying an application liquid in a small amount or with a very small width, there have been cases in which, when application is started from a standby state or when an application operation is repeatedly performed, the application state or application quantity changes if the time interval of the application operation changes, making it impossible to obtain the same application results. This problem presumably arises because the nozzle tip end dries over time, the fluidity of the application liquid declines (the viscosity thereof rises), and the liquid surface of the application liquid formed in a nozzle tip-end opening is drawn into the nozzle (the liquid surface height changes).

In the prior art, in order to avoid clogging of the nozzle, inferior application, and other such adverse circumstances caused, inter alia, by drying of the application liquid at the nozzle tip end, the nozzle is moved to a prescribed position and an application liquid discharge operation unrelated to the actual application operation is performed in cases when the application standby time is long, the discharge operation being referred to as "wasteful discharging." In such an operation, wasteful movement of the nozzle increases, and wasteful consumption of application liquid also increases. In addition, the location at which the wasteful discharging is performed is typically set apart from the application position, and it takes time to move the nozzle so as to return from the position at which the wasteful discharging is performed to the application position. When application is performed, inter alia, using a solution that has excellent drying properties, drying of the solution at the nozzle tip end is promoted while the nozzle is returned to the application position. Therefore, there are cases where the desired application cannot be performed, irrespective of whether wasteful discharging is performed.

In the application film formation device disclosed in Patent Document 2, the liquid surface at the tip end of the nozzle is drawn upward into the nozzle during standby, preventing drying of the application liquid at the nozzle tip end. Prior to application, the liquid surface of the application liquid that was drawn upward into the nozzle is drawn back down toward the nozzle-tip-end side, preventing a deficit in the amount of application liquid discharged from the nozzle during the first application after standby and thus preventing unevenness in application.

PRIOR ART DOCUMENTS

Patent Documents

Patent Document 1: JP 5802347 B
Patent Document 2: JP2000-223402 A

SUMMARY OF THE INVENTION

Problems to be Solved by the Invention

The method disclosed in Patent Document 2 presents an advantage in that it is unnecessary to move the nozzle to another location and perform wasteful discharging of the application liquid. However, this merely prevents drying, etc., through controlling the position of the liquid surface at the nozzle tip end. When the period in which no application operation is performed lengthens, a portion of the liquid surface of the application liquid that was drawn upward into the nozzle dries, and the viscosity thereof increases. There are cases where it is impossible to overcome drawbacks such as inferior application of the application liquid, insufficient application quantity, unevenness in application, etc., which arise in the first application operation after standing, merely by statically moving the liquid surface at the nozzle tip end up and down. In particular, adhesives, etc., which are used as application liquids in the field of semiconductor manufacturing and which differ from, e.g., the inkjet printer inks used in typical printing, have high viscosity and are applied in microvolume quantities. Therefore, inferior application readily occurs in the case of such adhesives.

With the foregoing in view, an object of the present invention is to provide a microvolume-liquid application method and a microvolume-liquid dispenser with which it is possible to apply a liquid without unevenness in application in a dotting application operation in which a small amount of the liquid is applied at unequal time intervals and in a line application operation in which the liquid is applied with a very small width at unequal time intervals.

In particular, an object of the present invention is to provide a microvolume-liquid application method and a microvolume-liquid dispenser with which it is possible to precisely apply a liquid using a nozzle having a very small diameter such that, when the liquid is applied so as to achieve a dot diameter or line width of approximately 500 μm or less, e.g., 50 μm or less, the prescribed dot diameter is achieved, in the same manner as when the operation for applying the liquid is performed at equal time intervals, even when the operation for applying the liquid is performed at unequal time intervals.

Means of Solving the Problems

In order to overcome the aforementioned problem, in the microvolume-liquid application method of the present invention, an application operation is performed in which a liquid is dispensed from a nozzle tip-end opening in a nozzle that faces an application surface across a first gap, and the liquid is applied to the application surface. When the application operation is not performed over a time interval longer than a set time interval, a liquid surface vibration operation is performed in which a tip-end liquid surface formed in the nozzle tip-end opening is caused to perform one cycle of moving outward and inward at a prescribed amplitude in a direction along the nozzle center axis relative to the nozzle tip-end opening, the liquid surface vibration operation being performed once or a plurality of times.

In the application operation, a pulsed first pressure is applied to a liquid within the nozzle, and a picoliter-quantity to nanoliter-quantity microvolume liquid is dispensed from the nozzle tip-end opening and brought into contact with the application surface. The first pressure is released, the liquid is drawn upward into the nozzle from the nozzle tip-end opening, and a microvolume droplet remains on the application surface in an applied state.

In the case of application at equal time intervals in which the application operation is repeated at a preset first time interval, the liquid surface height, which is the highest position of the tip-end liquid surface from the nozzle tip-end surface immediately before the first pressure is applied, is set to a first liquid surface height.

In the liquid surface vibration operation, the nozzle tip-end opening is caused to face the application surface across a second gap that is equal to or greater than the first gap, in which state a pulsed second pressure that is the same as or different from the first pressure is applied to the liquid within the nozzle, and the tip-end liquid surface is caused to vibrate at an amplitude that includes the position of the first liquid surface height. The liquid surface vibration operation is performed repeatedly, whereby a dry film of the liquid that is produced at the tip-end liquid surface is broken, and the broken dry film or thickened liquid is dissolved or mixed into the liquid within the nozzle. As a result, the characteristics of the liquid forming the tip-end liquid surface in the nozzle tip-end opening can be kept in an excellent state.

In particular, when the second pressure is set to a value greater than that for the first pressure or is applied for a longer time than is the first pressure, it is possible to dramatically displace the tip-end liquid surface at an amplitude that passes through the position of the first liquid surface height in the application operation. In a dry discharging operation in which no ink droplets are discharged, the dry discharging operation being performed in order to prevent clogging of the nozzle in a typical inkjet head, etc., the ink meniscus is vibrated at an amplitude lower than that used during actual printing so that no ink droplets are discharged. In the present invention, the tip-end liquid surface is vibrated at an amplitude higher than that used during application. The application liquid in the nozzle tip-end opening is actively mixed with the application liquid within the nozzle, and even in the case of a high-viscosity application liquid, the characteristics of the application liquid in the nozzle tip-end opening can be kept in a state suitable for application.

Additionally, in the present invention, in an application operation performed subsequently to a final liquid surface vibration operation, i.e., in the first application operation after application operations have not been performed over a long period of time, the first pressure is applied at a point in time when the tip-end liquid surface vibrating due to the final liquid surface vibration operation has returned to the position of the first liquid surface height in the case of usual application at equal time intervals. For example, if the time interval from the point in time when the second pressure is applied to when the tip-end liquid surface returns to the first liquid surface height is measured in advance, the point in time when the first pressure for the application operation is applied can be known in advance. As a result, an application operation after a long time interval can be performed in a state similar to that in a case of application at equal time intervals. Accordingly, even in such application at unequal time intervals, the operation for applying microvolume droplets can be precisely performed.

The liquid surface vibration operation may be configured to be performed at least twice. In a first liquid surface vibration operation that is performed first, a first pulse pressure comprising a prescribed pulse height and pulse width is applied, as the second pressure, such that the amplitude is higher than in the vibration of the tip-end liquid surface in the application operation (such that the tip-end liquid surface is dramatically displaced). This results in a state in which a quantity of liquid greater than the quantity dispensed in the case of application at equal time intervals is pushed out from the nozzle tip-end opening. In this case, the nozzle tip-end opening is made to face the application surface across a second gap greater than the first gap so that the liquid that is in the state of being pushed out from the nozzle tip-end opening does not contact the application surface. Thus, dramatically displacing the tip-end liquid surface makes it possible to reliably break the dry film of the application liquid that is produced at the tip-end liquid surface and to draw a portion of the broken dry film into the nozzle.

In a second liquid surface vibration operation that is performed second, a second pulse pressure comprising a prescribed pulse height and pulse width is applied, as the second pressure, such that the amplitude is higher than in the vibration in the application operation but lower than in the vibration in the first liquid surface vibration operation. The dry film that was broken by the first liquid surface vibration operation and then drawn into the nozzle, or other degraded portions of the application liquid, are thereby dissolved or mixed into the normal application liquid within the nozzle. As a result, it is possible to return characteristics such as the viscosity of the application liquid in the portion at the tip-end liquid surface to a state suitable for the application operation.

In the present invention, it is desirable to configure a liquid supply system for supply to the nozzle as follows in order to finely and precisely control the vibration of the tip-end liquid surface as described above. Specifically, a liquid passage for supplying the liquid from a liquid supply part to the nozzle is formed from an upstream-side passage section, an intermediate passage section, and a downstream-side passage section, the intermediate passage section being configured as a passage section that is capable of expanding and contracting such that the interior volume thereof increases and decreases. When the intermediate passage section is deformed such that the interior volume of the intermediate passage section decreases in a liquid-filled state in which the liquid fills the space from the liquid passage to the nozzle tip-end opening, the ratio of the liquid quantity pushed out from the intermediate passage section to the downstream-side passage section and the liquid quantity pushed back to the upstream-side passage section is set to 1:100-1:500 so that the liquid quantity pushed out from the intermediate passage section to the downstream-side passage section is a microvolume in an amount measured in nanoliters or picoliters.

In the application operation, in the liquid-filled state, the intermediate passage section is deformed so that the interior volume thereof decreases, the first pressure is actuated by the small amount of liquid pushed out from the intermediate passage section to the downstream-side passage section, and a microvolume liquid is dispensed from the nozzle tip-end opening. The deformation of the intermediate passage part is released to return the interior volume of the interior passage part to a normal volume, the first pressure is released due to the small amount of liquid returning from the downstream-side passage section into the intermediate passage section, and the liquid from the upstream-side passage section is drawn into the intermediate passage section.

Additionally, in the liquid surface vibration operation, the intermediate passage section is deformed so that the interior volume thereof decreases in the liquid-filled state. The second pressure is actuated by the small amount of liquid pushed out from the intermediate passage section to the downstream-side passage section, and the small amount of liquid from the nozzle tip-end side is expanded to push out the tip-end liquid surface. The deformation of the intermediate passage section is released to return the interior volume of the intermediate passage section to the normal volume, the second pressure is released due to the small amount of liquid returning from the downstream-side passage section into the intermediate passage section and the tip-end liquid surface is drawn in, and the liquid from the upstream-side passage section is drawn into the intermediate passage section.

The microvolume-liquid application method of the present invention makes it possible to precisely dispense or perform dropwise addition of a microvolume liquid present in an amount measured in nanoliters or picoliters from a nozzle having a very small diameter no greater than 500 μm; e.g., no greater than 100 μm, which was impossible in the prior art, and to apply the small amount of the liquid in a dotted or fine linear form in a state that is suitable for an application surface. Additionally, even when a high-viscosity liquid material having a viscosity of 1-100 Pa·s is used as the liquid, the microvolume liquid present in an amount measured in nanoliters or picoliters can be precisely applied to the application surface.

MODE FOR CARRYING OUT THE INVENTION

Embodiment of a microvolume-liquid dispenser to which the present invention is applied is described below with reference to the drawings.

Figure 1:
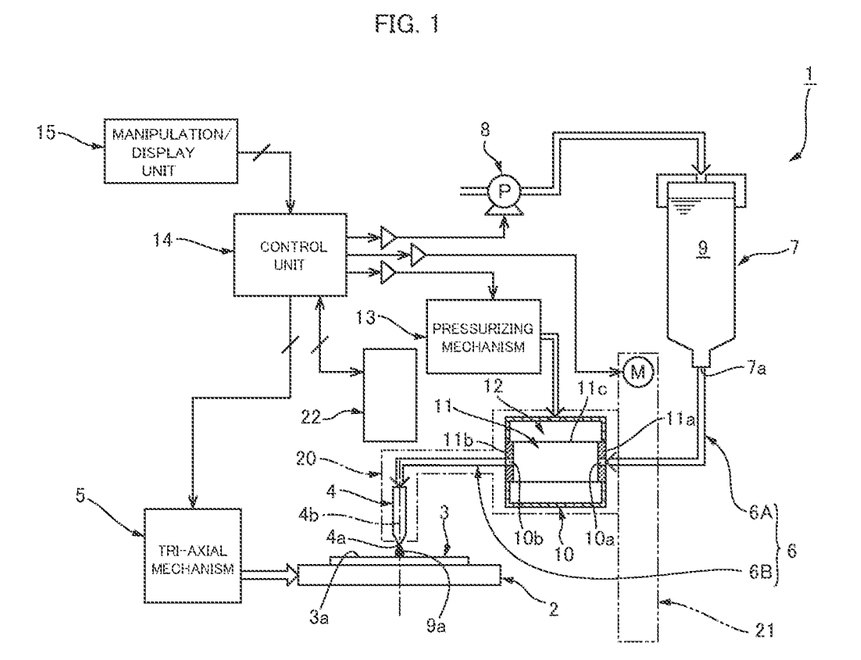
FIG. 1 is an overall structural diagram of a microvolume-liquid dispenser to which the present invention is applied.

FIG. 1 is an overall structural diagram of a microvolume-liquid dispenser according to Embodiment. The microvolume-liquid dispenser 1 comprises a workpiece platform 2, and a nozzle 4 for performing dropwise addition of a microvolume liquid at a prescribed position on, e.g., the surface of a workpiece 3 mounted on the workpiece platform 2. The workpiece platform 2 can be moved in the horizontal plane and in the vertical direction by, e.g., a tri-axial mechanism 5. It is also possible to secure the workpiece platform 2 and cause the nozzle 4 side to move in three axial directions.

In the present example, the nozzle 4 has a long thin cylindrical shape maintained in a perpendicular orientation, and a tip-end opening 4a of the nozzle 4 faces the surface of the workpiece 3 such that a suitable very small gap is formed therebetween, the operation for dispensing the microvolume liquid being carried out in this state. A liquid passage 6 having a greater inner diameter than the nozzle inner diameter is connected to the nozzle 4. The liquid passage 6 is connected to a liquid reservoir part, a liquid supply part being configured from a syringe 7 and a pump 8. In the syringe 7 is accommodated, e.g., a viscous liquid 9. The syringe 7 is supplied with compressed air from the pump, whereby the liquid accommodated in the syringe is supplied to the liquid passage 6.

The liquid passage 6 is formed from an upstream-side passage section 6A connected to the outlet 7a at the lower part of the syringe 7, an intermediate passage section 10, and a downstream-side passage section 6B linked to the nozzle 4. The nozzle 4 is cylindrical and is made of metal or another rigid material, and the downstream-side passage section 6B similarly is cylindrical and made of metal or another rigid material. The downstream-side passage section 6B has an inner diameter greater than the nozzle inner diameter. The interior volume of the downstream-side passage section 6B does not vary due to pressure fluctuations in the viscous liquid flowing through the interior. The upstream-side passage section 6A is formed from a flexible tube.

The intermediate passage section 10 is configured to be a variable-volume passage section. The intermediate passage section 10 has a cylindrical passage 11, the two ends of the cylindrical passage 11 being formed from rigid end plates 11a, 11b, and a cylindrical barrel part 11c being formed from a radially elastically deformable elastic film. The inner diameter of the cylindrical barrel part 11c is greater than that of the downstream-side passage section 6B and the upstream-side passage section 6A.

A pressure chamber 12, which is a sealed outer-peripheral space of annular cross-section, is formed coaxially surrounding the cylindrical barrel part 11c of the cylindrical passage 11. The pressure chamber 12 is connected to a pressurizing mechanism 13. The pressure chamber 12 is capable of increasing the internal pressure of the pressure chamber 12 using the pressurizing mechanism 13. When the pressure chamber 12 is pressurized, the cylindrical barrel part 11c of the cylindrical passage 11 contracts radially inward in an axially symmetrical state, and the interior volume of the cylindrical passage 11 decreases. When the pressurization is stopped by the pressurizing mechanism 13, the cylindrical barrel part 11c can elastically recover its original cylindrical shape, and the interior volume can return to normal. In this manner, the pressure chamber 12 and the pressurizing mechanism 13 cause the cylindrical passage 11 to flex in an axially symmetrical state, constituting a passage-deforming part for increasing and decreasing the interior volume of the cylindrical passage 11.

It is also possible to use a depressurizing mechanism for reducing the pressure in the pressure chamber 12, in lieu of the pressurizing mechanism 13, as the passage-deforming part. In this case, the viscous liquid 9 is taken into the cylindrical passage 11 in a state in which the interior volume of the cylindrical passage 11 is increased due to the reduced-pressure state, and stopping the reduced-pressure state makes it possible to reduce the interior volume of the cylindrical passage 11 and push out the viscous liquid 9 in the interior. Alternatively, it is also possible to use a pressurizing/depressurizing mechanism in lieu of the pressurizing mechanism 13. In this case, the viscous liquid 9 is taken into the cylindrical passage 11 in a state in which the interior volume of the cylindrical passage 11 is increased due to a reduced-pressure state, and the viscous liquid 9 is pushed out by switching to a pressurized state and reducing the interior volume of the cylindrical passage 11. The amount of the viscous liquid 9 that is pushed out can be increased by increasing or decreasing the interior volume of the cylindrical passage 11.

The nozzle 4, the downstream-side passage section 6B, and the intermediate passage section 10 are integrated to form a micromotion unit 20 that is capable of moving. The micromotion unit 20 is the portion in FIG. 1 that is surrounded by chain lines. The micromotion unit 20 is capable of moving in a linear reciprocating manner along a center axis 4b of the nozzle 4 due to a linear motion mechanism 21 (shown in FIG. 1 by imaginary lines) that constitutes a unit micromotion mechanism. When the micromotion unit 20 moves, a gap between the nozzle tip-end opening 4a and an application surface 3a of the workpiece 3 for application that is mounted on the workpiece platform 2 increases or decreases in size.

An observation optical system unit 22 is disposed above the nozzle 4. The observation optical system unit 22 is capable of observing the nozzle tip-end opening 4a and a portion of the application surface 3a of the workpiece 3 using a CCD camera. Additionally, a laser displacement meter or other measurement mechanism is combined with the observation optical system unit 22, the measurement mechanism being capable of measuring the gap between the nozzle tip-end opening 4a and the application surface 3a of the workpiece surface that faces the nozzle tip-end opening 4a.

The pump 8 for supplying the liquid, the pressurizing mechanism 13, the tri-axial mechanism 5, the linear motion mechanism 21, the observation optical system unit 22, and other components described above are controlled by a control unit 14. The control operation by the control unit 14 is performed on the basis of manipulation input from the manipulation unit of a manipulation/display unit 15, and enables the display unit of the manipulation/display unit 15 to display the operation state of the components, an observation image captured by the observation optical system unit 22, etc.

In the microvolume-liquid dispenser 1 configured in this manner, the nozzle 4 has a very small diameter, and has a long and thin cylindrical shape such that the inner diameter of the nozzle tip-end opening 4a of the nozzle is 500 μm or less, e.g., 100 μm. Because the nozzle 4 has a very small diameter, the liquid passage resistance on the downstream side of the intermediate passage section 10 is much greater than the liquid passage resistance on the upstream side.

In the present example, when the intermediate passage section 10 is caused to contract so that the interior volume thereof decreases in a liquid-filled state in which the viscous liquid fills the liquid passage 6 and the nozzle tip-end opening 4a of the nozzle 4, the ratio of the liquid quantity pushed out from the intermediate passage section 10 to the downstream-side passage section 6B and the liquid quantity pushed back to the upstream-side passage section 6A is set to a value within a range of 1:100-1:500 so that the liquid quantity pushed out from the intermediate passage section 10 to the downstream-side passage section 6B is a microvolume in an amount measured in nanoliters or picoliters. Specifically, the liquid passage resistance on the downstream side of the intermediate passage section 10 is set so as to be much greater than the liquid passage resistance on the upstream side so that such a ratio is reached.

Figure 2A:
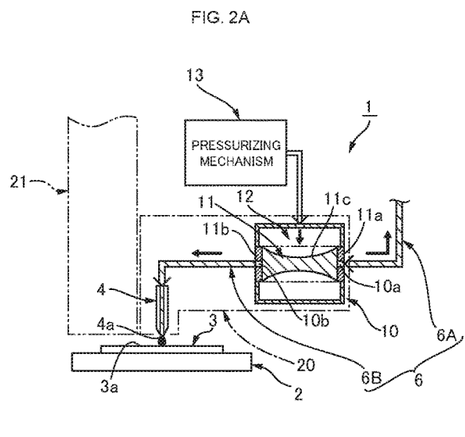
FIGS. 2A and 2B are schematic views indicating the movement of an intermediate passage section of the microvolume-liquid dispenser.
Figure 2B:
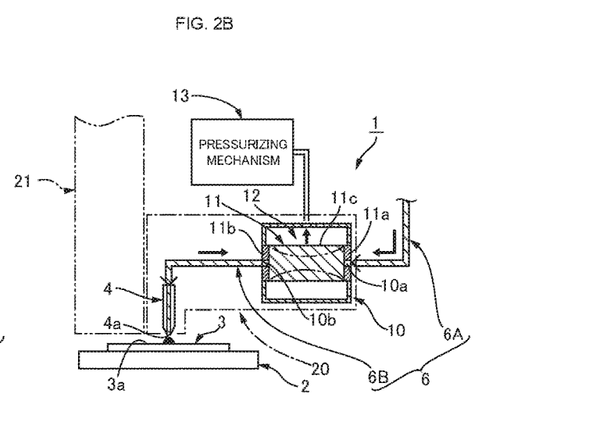
Figure 3:
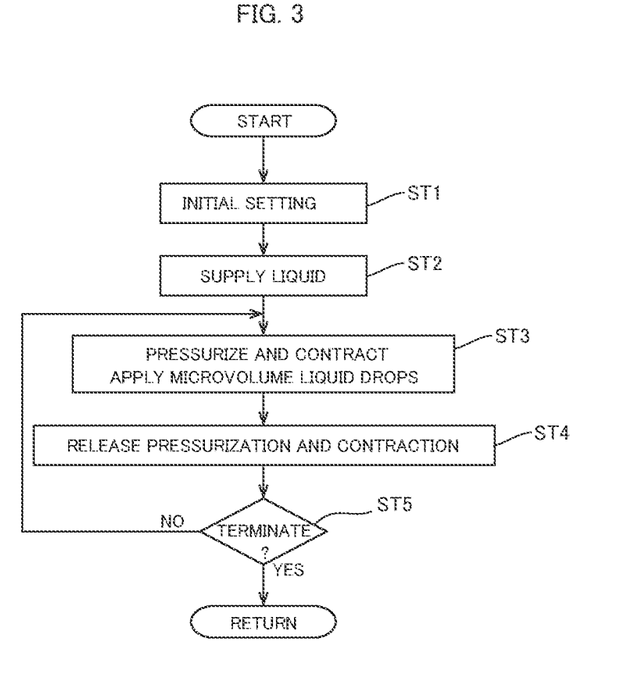
FIG. 3 is a general flowchart indicating an application operation of the microvolume-liquid dispenser.

FIGS. 2(*a*) and 2(*b*) are schematic views indicating the movement of the intermediate passage section 10, and FIG. 3 is a general flowchart indicating the operation of the microvolume-liquid dispenser 1. An explanation is given with reference to these drawings. First, the workpiece 3 to be worked on is mounted on the workpiece platform 2, and an initial setting operation, such as causing the nozzle tip-end opening 4a to face a position on the workpiece 3 for the dropwise addition of the microvolume liquid from directly above said position across a fixed gap, is performed (step ST1 in FIG. 3).

In this operation, the tri-axial mechanism 5 is driven by the control unit 14, and the nozzle tip-end opening 4a is positioned at a liquid application initial position for the application surface 3a of the workpiece surface. A control is then performed by the control unit 14 to drive the linear motion mechanism 21, the micromotion unit 20 is caused to move by a very small amount in the vertical direction, and the gap between the nozzle tip-end opening 4a and the application surface 3a is minutely adjusted. In the application operation, the gap is set to a first gap. The minute adjustment of the gap may be performed through vertical micromotions of only the micromotion unit 20, and therefore the gap can be precisely and quickly adjusted.

The pump 8 is then driven to control the supply of compressed air, and a liquid-filled state is achieved in which the liquid fills the space from the syringe 7 through the liquid passage 6 to the nozzle tip-end opening 4a of the nozzle 4 (step ST2 in FIG. 3).

In the operation for applying the microvolume liquid to the application surface 3a, the supply of compressed air to the syringe 7 by the pump 8 is halted to stop the liquid supply operation, and the pressurizing mechanism 13 is driven to raise the internal pressure in the pressure chamber 12 to a pre-set pressure in a pulsed manner. This pressurizes the variable-volume passage section 10 from the outside and causes the cylindrical barrel part 11c to contract. As a result, as shown in FIG. 2(*a*), the interior volume of the intermediate passage section 10 decreases (step ST3 in FIG. 3).

When the intermediate passage section 10 contracts, the liquid held in the interior thereof is pushed out from each of a downstream-side end opening 10b and an upstream-side end opening 10a and is branched toward the downstream side and the upstream side. The branched amount of the viscous liquid 9 pushed out toward the downstream side is determined in accordance with the ratio of the liquid passage resistance of the downstream side including the downstream-side passage section 6B and the nozzle 4 and the liquid passage resistance of the upstream-side passage section 6A.

Because the liquid passage resistance on the downstream side is significantly greater, a small amount of liquid is pushed out toward the downstream side. The pulsed first pressure formed due to microvolume liquid pushed out toward the downstream side temporarily increases the internal pressure in the downstream-side passage section 6B, whereby the microvolume liquid of a prescribed volume is dipsensed from the nozzle tip-end opening 4a of the nozzle 4 and brought in contact with the application surface 3a.

The pressurization applied by the pressurization mechanism 13 is then stopped, and the pressure chamber 12 is returned to, e.g., an atmospheric-pressure state (step ST4 in FIG. 3). As a result, as shown in FIG. 2(b), the cylindrical barrel part 11c of the intermediate passage section 10 expands radially outward and elastically recovers its original cylindrical shape. Liquid is thereby drawn from both the upstream-side passage section 6A and the downstream-side passage section 6B into the intermediate passage section 10.

The amount of liquid flowing in also corresponds to the ratio of the upstream-side and downstream-side liquid passage resistances. Accordingly, only a very small amount of liquid is drawn back to the upstream side from the downstream-side passage section 6B on the nozzle 4 side. The first pressure that was actuated within the nozzle 4 is thereby released, and in the nozzle tip-end opening 4a, the liquid is drawn upward enough to prevent breaking of the liquid meniscus. Specifically, the application liquid is drawn upward from the nozzle tip-end opening 4a toward the interior of the nozzle, and a small amount of droplet 9a remains on the application surface 3a. The tip-end surface (meniscus) of the liquid that is formed upon separation from the droplet 9a returns to the nozzle tip-end opening 4a side.

In the operation for applying the microvolume liquid, the first gap between the nozzle tip-end opening 4a and the application surface 3a is adjusted so that the gap is very small. Therefore, in the operation for performing dropwise addition of the high-viscosity liquid, the microvolume liquid that flowed out from the nozzle tip-end opening 4a and contacted the application surface 3a may reach a state of bridging to the application surface 3a without fully separating from the nozzle tip-end opening 4a.

In such an operation for applying the high-viscosity liquid, in a case where, e.g., a preliminary application operation has been performed and the observation optical system unit 22 has confirmed such a state, the micromotion unit 20 is caused by the linear motion mechanism 21 to move by a very small amount at a suitable timing during the application of the microvolume liquid in a main application operation, and an operation for pulling the nozzle 4 upward is performed. This makes it possible to satisfactorily cut off the liquid and precisely apply the microvolume liquid onto the application surface 3a in a suitable state. The operation for applying the microvolume liquid at equal time intervals, i.e., application at equal time intervals, is then performed, e.g., only a required number of times. The application operation is then terminated (steps ST3, ST4, and ST5 in FIG. 3).

(Application at Equal Time Intervals and Application at Unequal Time Intervals)

Figure 4:
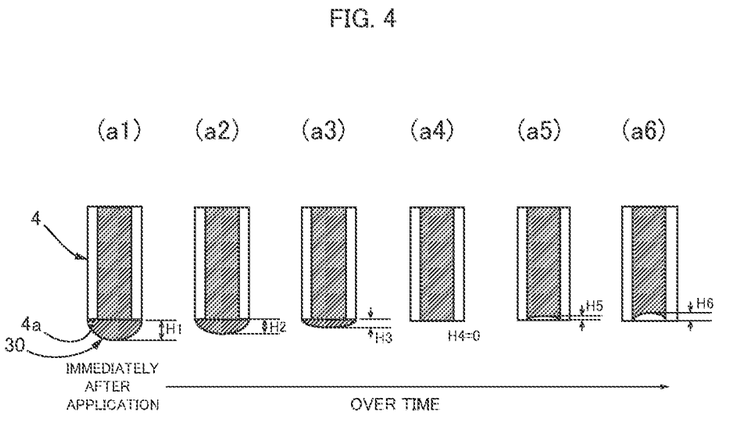
FIG. 4, which includes parts (a1), (a2), (a3), (a4), (a5), and a(6), is a schematic view indicating transitional changes in the tip-end liquid surface after a single application operation.

FIG. 4 is a schematic view indicating transitional changes in the tip-end liquid surface of the liquid formed in the nozzle tip-end opening 4a after a single application operation. The tip-end liquid surface 30 is formed in the nozzle tip-end opening 4a in a convex spherical shape or a concave spherical shape. The distance from the nozzle tip-end opening 4a to the highest position of the tip-end liquid surface 30 in the direction of the nozzle center axis is referred to as the "liquid surface height." FIG. 4(a1) shows the liquid surface height H1 of the tip-end liquid surface 30 immediately after the application operation. From this state, the liquid surface height of the tip-end liquid surface 30 recedes in a sequential manner in a direction toward the interior of the nozzle as time passes, as shown in FIG. 4(a2)-4(a4). Specifically, the liquid surface height gradually decreases to liquid surface height H2 through H4 in order. Furthermore, as time passes, the tip-end liquid surface 30 is drawn into the nozzle and becomes curved due to drying, etc., reaching a state of a negative liquid surface height H5, H6, as shown in FIG. 4(a5)-4(a6).

Figure 5:
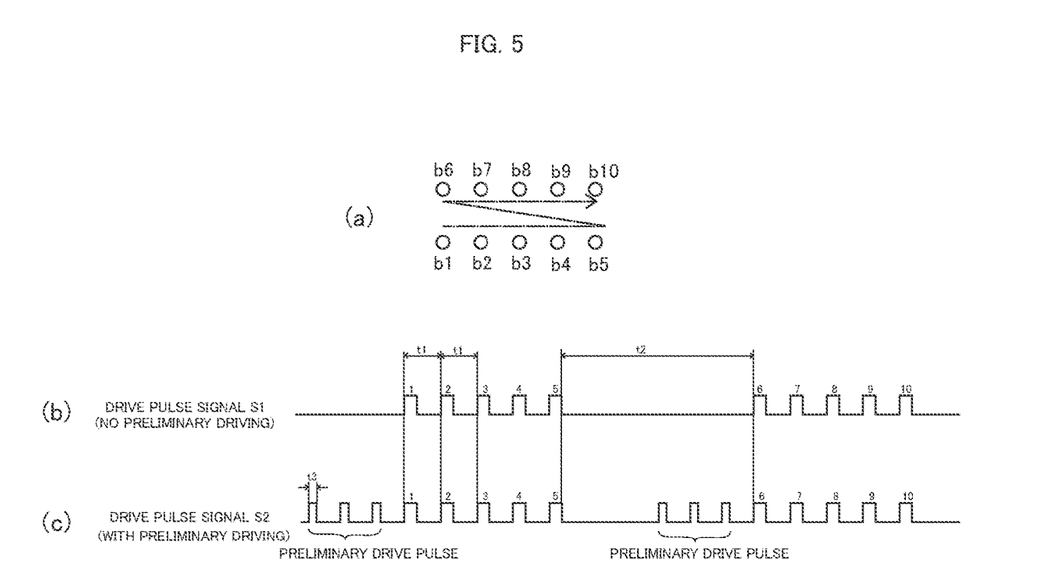
FIG. 5 includes parts (a), (b), and (c), wherein (a) is a schematic view showing one example of a dotting application, (b) is a waveform chart showing drive pulse signals in a case where no liquid surface vibration is performed, and (c) is a waveform chart showing drive pulse signals in a case where liquid surface vibration is performed.

As shown in FIG. 5(a), a case is considered in which a dotting application operation for applying a droplet in a dot shape having a very small diameter is performed at each point b1-b10 on the application surface 3a. In this case, a situation is described in which a drive pulse signal S1 for application is supplied from the control unit 14 to the pressurizing mechanism 13, as in the example shown in, e.g., FIG. 5(b). For points b1-b5, application at equal time intervals is performed using application interval t1. However, for the purpose of moving from point b5 to point b6, the application interval between these two points is lengthened to t2. The application operation for points b6-b10 following this movement is, once again, application at equal time intervals using application interval t1.

In the case of such application operations, the application state for points b2-b5 and b7-b10 through the application at equal time intervals is uniform. In these application operations, when application at time interval t1 is performed repeatedly, the liquid surface height of the tip-end liquid surface 30 in the nozzle tip-end opening 4a immediately before application is in the same state. Specifically, the liquid surface height of the tip-end liquid surface 30 at the point in time when the pulses of the drive pulse signal S1 start, which is the point in time immediately before the first pressure is applied, is fixed during application for each of the points; for example, the liquid surface height H2 (the first liquid surface height) shown in FIG. 4(a2) is reached. Accordingly, it is possible to precisely dispense a fixed amount of the liquid and apply liquid dots having a prescribed diameter to the application surface 3a.

However, due to transitional changes in the liquid surface height of the tip-end liquid surface 30, there are situations where the application at point b1 is affected by a long standby time before the start of the application, or by the liquid-filled state of the nozzle tip end during initial setting; for example, the liquid surface height may recede to a negative liquid-surface-height position that is drawn into the nozzle, as shown in FIG. 4(a6). When the liquid surface height recedes to a negative position, or when increases in viscosity or other such effects are imparted due to drying that occurs together with such receding, the amount of liquid dispensed from the nozzle tip-end opening 4a could significantly decrease in the application operation for point b1 to a greater extent than in the case of application at equal time intervals. Additionally, the application at point b6 is affected by the long application interval t2 required for movement; the liquid surface height of the tip-end liquid surface 30 ultimately reaches a position drawn further upward into the nozzle than in the case shown in FIG. 4(a2), e.g., reaches the state of the liquid surface height H5 shown in FIG. 4(a5), and the application amount readily decreases to less than that in the case of application at equal time intervals.

(First Example of Controlling Liquid Surface Vibration Operation)

In order to resolve such adverse circumstances the control unit 14 is provided with a control function for performing a liquid surface vibration operation (preliminary pulse driving) once or a plurality of times before the first application operation after initial settings are set and when application operations have not been performed over a period of time longer than a set time interval, the liquid surface vibration operation involving causing the tip-end liquid surface 30 formed in the nozzle tip-end opening 4a to perform one cycle of moving outward and inward at a prescribed amplitude in a nozzle inward-outward direction relative to the nozzle tip-end opening 4a.

For example, when the dotting application operation for points b1-b10 as shown in FIG. 5(a) is performed, the control unit 14 controls the application operation such that, e.g., the drive pulse signal S2 shown in FIG. 5(c) is supplied to the pressurization mechanism 13. In this case, preliminary pulse driving is performed a plurality of times, e.g., three times before the start of application. Preliminary pulse driving is also performed a plurality of times, e.g., three times during the application interval t2 for moving from point b5 to point b6.

Performing the preliminary pulse driving before application at point b1, which is the first application operation, makes it possible to change the liquid surface height of the tip-end liquid surface 30 through, e.g., the sequence in FIG. 4(a1)-4(a6). In the dotting application operation at point b1, it is possible to perform the application operation such that a drive pulse is imparted while the liquid surface height is at the position of liquid surface height H2 in FIG. 4(a2), which is the same as in the case of application at equal time intervals. This makes it possible to apply the same amount of liquid to the application surface 3a as that in the case of application at equal time intervals. Imparting a drive pulse at the same timing in the dotting application operation at point b6 as well makes it possible to apply the same amount of liquid to the application surface 3a.

When the application interval t1 in the application at equal time intervals is greater than a set time interval, preliminary pulse driving may be performed during each application operation. This makes it possible to control the liquid surface height during application to the liquid surface height H2 shown in FIG. 4(a2) and to accurately apply the liquid in a desired application amount.

(Second Example of Controlling Liquid Surface Vibration Operation)

Figure 6:
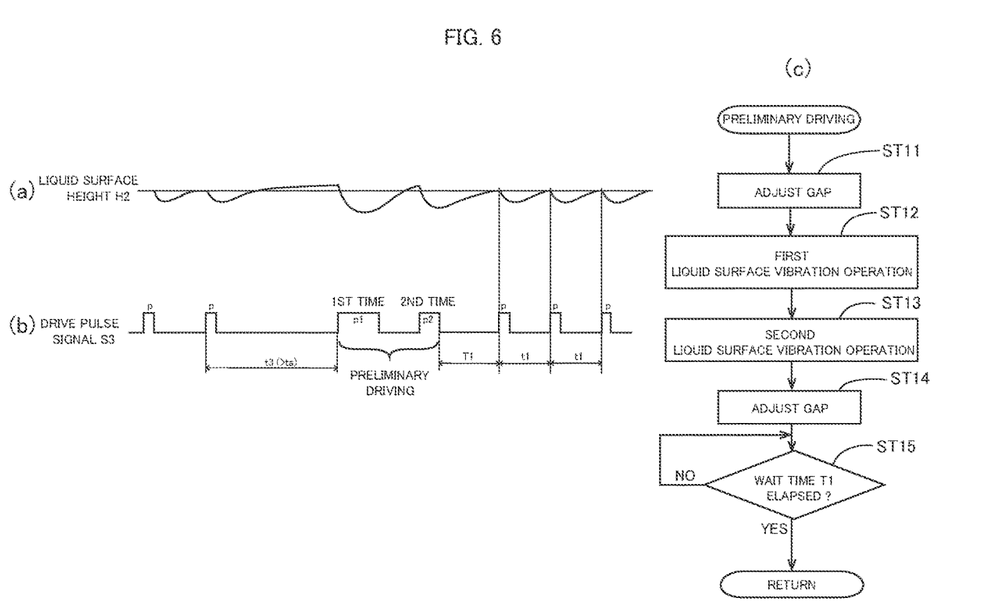
FIG. 6, which includes parts (a), (b), and (c), is a schematic view showing another example of a liquid surface vibration operation, where (a) is a schematic view showing an example of the change over time in the liquid surface height of the tip-end liquid surface, (b) is a waveform chart showing an example of a drive pulse signal for application, and (c) is a general flowchart indicating the flow of the operation.

FIG. 6 is a schematic view showing another example of a liquid surface vibration operation performed by the control unit 14, where FIG. 6(a) is a schematic view showing an example of the change over time in the liquid surface height of the tip-end liquid surface 30, FIG. 6(b) is a waveform chart showing an example of a drive pulse signal S3 for application, and FIG. 6(c) is a general flowchart indicating the flow of the operation in an interrupt processing for the preliminary driving (liquid surface vibration operation). The example shown illustrates a case in which an application interval t3 exceeding a set time interval ta is employed after a drive pulse p for application is imparted and a dotting application operation is performed, and a subsequent dotting application operation is then performed.

When the time elapsed after the application operation exceeds a set time interval ta, the control unit 14 performs a liquid surface vibration operation. In the liquid surface vibration operation of the present example, a control is performed to drive the micromotion unit 20, and the nozzle tip-end opening 4a is caused to face the application surface 3a across a second gap, which is greater than the first gap (step ST11 in FIG. 6(c)). In this state, a liquid surface vibration operation is performed in which a pulsed second pressure different from the first pressure is applied to the liquid filling the nozzle 4 and the tip-end liquid surface 30 is caused to vibrate at a high amplitude that includes the position of a first liquid surface height H2 (FIG. 4(a2)).

The liquid surface vibration operation is performed, e.g., at least twice. In a first liquid surface vibration operation (step S12 in FIG. 6(c)) that is performed first, a first pulse p1 comprising a prescribed pulse height and pulse width is applied such that the amplitude is higher than in the vibration of the tip-end liquid surface 30 in application at equal time intervals (application interval t1). The tip-end liquid surface 30 is thereby vibrated once at a high amplitude. In a second liquid surface vibration operation (step S13 in FIG. 6(c)) that is performed second, a second pulse p2 comprising a prescribed pulse height and pulse width is applied such that the amplitude is higher than in the vibration in application at equal time intervals (application interval t1) but lower than in the vibration in the first liquid surface vibration operation.

A case where a dotting application is performed to a diameter of, e.g., no greater than five times the inner diameter of the nozzle 4 used is described as an example. The amount of liquid pushed out from the nozzle tip-end opening 4a in the first liquid surface vibration operation performed first is set within a range of 1-10, where 1 is a single application amount in a case where application is performed at equal time intervals. The amount of liquid pushed out in the second liquid surface vibration operation performed second is set within a range of 1-2, which is smaller than that used for the first amount of liquid.

The initial first liquid surface vibration operation is performed in order to break a dry film produced at the tip-end liquid surface 30. In an adjustment to increase the displacement of the tip-end liquid surface 30 (to increase the amplitude), the value of the applied first pulse p1 is increased and the second pressure acting within the nozzle 4 is increased. Alternatively, the width of the first pulse p1 is increased and the actuation time of the second pressure acting within the nozzle 4 is increased. As shall be apparent, both of these sets of parameters may be increased.

The subsequent second liquid surface vibration operation causes the broken dry film to vibrate, whereby the broken dry film is dissolved or mixed into the application liquid within the nozzle 4. The viscosity and other characteristics of the liquid in the portion at the tip-end liquid surface 30 are thereby returned to a state suitable for application. The second liquid surface vibration operation may be performed once or a plurality of times on the basis of the viscosity, drying properties, or other characteristics of the liquid. In the first and second liquid surface vibration operations, it is possible to push out the liquid from the nozzle tip end in an amount greater than the amount of liquid present at the nozzle tip end immediately before the application operation.

In parallel with the second liquid surface vibration operation, a control is performed to drive the micromotion unit 20, and the nozzle tip-end opening 4a returned to the first gap for application from the second gap relative to the application surface 3a (step ST14 in FIG. 6(c)). A subsequent application is performed at a timing at which the tip-end liquid surface 30 of the derived liquid returns to the liquid surface height position (FIG. 4(a2)) from immediately before the application performed at equal time intervals, as described above. Specifically, the wait time T1 from the point in time when the second pulse p2 of the final second liquid surface vibration operation starts to when the drive pulse p of the application operation starts is measured and set in advance so that the liquid surface height returns to the same height position as in the case of application at equal time intervals as shown in FIG. 4(a2) at the point in time when the drive pulse p is impressed in the application operation performed subsequently to the second liquid surface vibration operation. Once the wait time T1 has elapsed, the flow of operations transitions to the next application operation (step S15 in FIG. 6(c)).

As described above, the liquid surface vibration operation is performed at least twice before the application operation. In addition, the wait time T1 from the final liquid surface vibration operation to the application operation is set so that the liquid surface height returns to the same height position as in the case of application at equal time intervals as shown in FIG. 4(a2) at the point in time when the drive pulse p is impressed in the application operation. This makes it possible to precisely apply a very small amount of droplet to the application surface even in the case of application at unequal time intervals.

In the case of a line application operation as well, the liquid surface vibration operation is performed the required number of times, and the liquid surface height from immediately before application in the subsequent application operation is prepared, thereby making it possible to precisely draw a fine line drawing on the application surface 3a in the same manner.

According to experiments by the inventors, it was confirmed that even when a nozzle having a nozzle tip-end opening 4a 25-100 μm in size is used as the nozzle 4 and a high-viscosity liquid having a viscosity of 50-100 Pa·s is applied at unequal time intervals, it is possible to precisely apply the liquid in a microvolume of several tens of picoliters to several nanoliters.

Parameters such as the amount of contraction and the contraction speed of the intermediate passage section 10 can be suitably set on the basis of the following parameters:

the amount of liquid discharged at once or caused to fall in droplets from the nozzle tip-end opening 4a;

the inner-diameter dimension of the nozzle tip-end opening 4a;

the viscosity of the liquid; and the ratio between the liquid passage resistance of the upstream-side passage section 6A and the liquid passage resistance of the downstream side including the downstream-side passage section 6B and the nozzle 4.

Parameters such as the nozzle used, the liquid used, and the amount of liquid added dropwise in a single operation are pre-set, and therefore driving of each component as performed by the control unit 14 may be controlled in accordance with these parameters. The ratio between the liquid passage resistances of the upstream-side passage section 6A and the downstream-side passage section 6B can be variably controlled. For example, a flow rate adjustment valve can be attached to the upstream-side passage section 6A, and the flow rate adjustment valve can be controlled by the control unit 14. Adjusting the flow rate in advance of the operation for performing dropwise addition of the microvolume liquid onto the workpiece 3 makes it possible to adjust the ratio between the liquid passage resistance of the upstream-side passage section 6A and the liquid passage resistance on the downstream side including the downstream-side passage section 6B and the nozzle 4.

Additionally, actually measuring the first and second pressures applied to the nozzle, the application interval t1 in the case of application at equal intervals, the pulse width and height of the preliminary drive pulse, the wait time T1, and other such parameters as well in a state in which parameters such as the amount of contraction and the contraction speed of the intermediate passage section are set on the basis of the aforementioned parameters makes it possible to set each of these parameters so as to obtain a desired application state.

The method and the dispenser of the present invention can be used in the application of a variety of materials. For example, materials such as the following can be used:

metal pastes (Ag, Cu, solder, etc.);

resin liquid materials (silicone adhesives, UV-curable resins, photoresists, UV-curable adhesives, and various other resin liquid agents); and filler-containing liquids (where the filler comprises fluorescent particles, silica particles, a fritted glass, titanium oxide, various nanomicroparticles, etc.).

Additionally, the technical fields to which the present invention can be applied include fields such as the following:

adoption in optical component manufacturing (application on light-shielding materials, formation of apertures, application of various materials on lens surfaces);

dropwise application of extremely small amounts of adhesive onto electronic components (LEDs, liquid crystal oscillators, MEMSs, power devices, etc.);

laminating flat panel displays (FPDs) and imaging sensors on glass; and wiring by Ag nanopastes (formation of auxiliary wiring on ITOs, formation of wirings in very small areas, etc.).

The invention claimed is:

1. A microvolume-liquid application method including the steps of:

performing an application operation for dispensing a nanoliter-quantity to picoliter-quantity microvolume liquid from a nozzle tip-end opening in a nozzle that faces an application surface across a first gap, to apply the liquid to the application surface; and performing a liquid surface vibration operation for causing a tip-end liquid surface formed in the nozzle tip-end opening to perform one cycle of moving outward and inward at a prescribed amplitude in a direction along a nozzle center axis relative to the nozzle tip-end opening, the liquid surface vibration operation being performed when the application operation is not performed over a time interval longer than a set time interval, wherein, the application operation is carried out so that:

a pulsed first pressure is applied to the liquid within the nozzle to dispense the microvolume liquid from the nozzle tip-end opening and bring the microvolume liquid into contact with the application surface;

the first pressure is released to draw the liquid upward into the nozzle from the nozzle tip-end opening; and a state is formed in which a microvolume droplet is applied on the application surface, wherein the liquid surface vibration operation is carried out so that:

the nozzle tip-end opening is caused to face the application surface across a second gap that is equal to or greater than the first gap; and a pulsed second pressure that is the same as or different from the first pressure is applied to the liquid within the nozzle, to cause the tip-end liquid surface to vibrate at an amplitude that includes a position of a first liquid surface height, wherein, when the application operation is performed subsequently to the liquid surface vibration operation, the first pressure is applied at a point in time when the tip-end liquid surface vibrating due to the liquid surface vibration operation is returned to the position of the first liquid surface height, and wherein,
the first liquid surface height is a highest liquid surface height of the tip-end liquid surface from the nozzle tip-end surface immediately before the first pressure is applied in a case in which the application operation is repeated at a preset first time interval.

2. The microvolume-liquid application method according to claim 1,
wherein the liquid surface vibration operation includes at least first and second liquid surface vibration operations;
the first liquid surface vibration operation is carried out so that:
a first vibration pressure is applied as the second pressure,
pulse height and pulse width of the first vibration pressure being set so that an amplitude of vibration of the tip-end liquid surface is greater than in a vibration of the tip-end liquid surface in the application operation; and
the second liquid surface vibration operation performed after the first liquid surface vibration is carried out so that:
a second vibration pressure is applied as the second pressure,
pulse height and pulse width of the second vibration pressure being set so that an amplitude of vibration of the tip-end liquid surface is greater than in the vibration of the tip-end liquid surface in the application operation and is smaller than in the vibration of the first liquid surface vibration operation.

3. The microvolume-liquid application method according to claim 1,
Wherein
a liquid passage for supplying the liquid from a liquid supply part to the nozzle is formed from
an upstream-side passage section,
an intermediate passage section, and
a downstream-side passage section,
the intermediate passage section being configured to expand and contract so as to increase or decrease in interior volume,
wherein,
when the intermediate passage section is deformed such that the interior volume thereof decreases in a liquid-filled state in which the liquid fills a portion from the liquid passage to the nozzle tip-end opening,
a ratio of an amount of liquid pushed out from the intermediate passage section to the downstream-side passage section and an amount of liquid pushed back to the upstream-side passage section is set to 1:100-1:500 so that the amount of pushed-out liquid from the intermediate passage section to the downstream-side passage section is a nanoliter or picoliter quantity,
wherein,
the application operation is carried out so that:
the intermediate passage section is deformed so that the interior volume thereof decreases in the liquid-filled state;
the first pressure is actuated by the amount of liquid pushed out from the intermediate passage section to the downstream-side passage section, to dispense a microvolume liquid from the nozzle tip-end opening; and
the deformation of the intermediate passage part is stopped to return the interior volume of the interior passage part to an original volume, and the first pressure is released due to the liquid returning from the downstream-side passage section into the intermediate passage section, and the liquid from the upstream-side passage section is drawn into the intermediate passage section, and
wherein,
the liquid surface vibration operation is carried out so that:
the intermediate passage section is deformed so that the interior volume thereof decreases in the liquid-filled state;
the second pressure is actuated by the liquid pushed out from the intermediate passage section to the downstream-side passage section, and the liquid from the nozzle tip-end side is push out the tip-end liquid surface; and
the deformation of the intermediate passage section is stopped to return the interior volume of the intermediate passage section to the original volume, the second pressure is released due to the liquid returning from the downstream-side passage section into the intermediate passage section and the tip-end liquid surface is drawn in, and the liquid from the upstream-side passage section is drawn into the intermediate passage section.

4. The microvolume-liquid application method according to claim 1,
wherein the nozzle has an inner diameter of 500 µm or less.

5. The microvolume-liquid application method according to claim 1, in combination with the liquid
wherein the liquid has a viscosity of 1-100 Pa·s.

* * * * *